(12) United States Patent
Li et al.

(10) Patent No.: US 7,335,456 B2
(45) Date of Patent: Feb. 26, 2008

(54) TOP COAT MATERIAL AND USE THEREOF IN LITHOGRAPHY PROCESSES

(75) Inventors: Wenjie Li, Poughkeepsie, NY (US); Margaret C. Lawson, LaGrangeville, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 580 days.

(21) Appl. No.: 10/855,045

(22) Filed: May 27, 2004

(65) Prior Publication Data

US 2005/0266354 A1    Dec. 1, 2005

(51) Int. Cl.
G03F 7/00 (2006.01)
G03F 7/004 (2006.01)

(52) U.S. Cl. ............... 430/270.1; 430/273.1; 430/281.1; 430/286.1

(58) Field of Classification Search ............. 430/270.1, 430/273.1, 281.1, 286.1
See application file for complete search history.

(56) References Cited

U.S. PATENT DOCUMENTS

| | | | |
|---|---|---|---|
| 5,240,812 A | 8/1993 | Conley et al. | |
| 5,595,861 A | 1/1997 | Garza | |
| 5,744,537 A | 4/1998 | Brunsvold et al. | |
| 5,879,853 A | 3/1999 | Azuma | |
| 6,057,080 A | 5/2000 | Brunsvold et al. | |
| 6,274,295 B1 | 8/2001 | Dammel et al. | |
| 6,534,239 B2 | 3/2003 | Varanasi et al. | |
| 6,635,401 B2 | 10/2003 | Li et al. | |
| 2004/0161698 A1* | 8/2004 | Kanasabapathy et al. | 430/270.1 |

OTHER PUBLICATIONS

"Technology Backgrounder: Immersion Lithography," published by ICKnowledge.com at http://www.icknowledge.com, May 28, 2003.

L. Geppert, "Chip Making's Wet New World," IEEE Spectrum, vol. 41, Issue 5, May 2004, pp. 29-33.

* cited by examiner

Primary Examiner—Amanda C. Walke
(74) Attorney, Agent, or Firm—Steven Capella

(57) ABSTRACT

A top coat material for applying on top of a photoresist material is disclosed. The top coat material includes a polymer, which includes at least one fluorosulfonamide monomer unit having one of the following two structures:

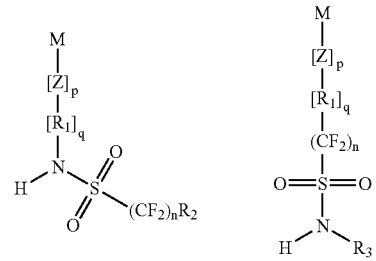

wherein: M is a polymerizable backbone moiety; Z is a linking moiety selected from the group consisting of —C(O)O—, —C(O)—, —OC(O)—, and —O—C(O)—C(O)—O—; $R_1$ is selected from the group consisting of an alkylene, an arylene, a semi- or perfluorinated alkylene, and a semi- or perfluorinated arylene; p and q are 0 or 1; $R_2$ is selected from the group consisting of hydrogen, fluorine, an alkyl group of 1 to 6 carbons, and a semi- or perfluorinated alkyl group of 1 to 6 carbons; n is an integer from 1 to 6; and $R_3$ is selected from the group consisting of hydrogen, an alkyl, an aryl, a semi- or perfluorinated alkyl, and a semi- or perfluorinated aryl. The top coat material may be used in lithography processes, wherein the top coat material is applied on a photoresist layer. The top coat material is preferably soluble in aqueous alkaline developer. The top coat material is also preferably insoluble in water, and is therefore particularly useful in immersion lithography techniques using water as the imaging medium.

21 Claims, No Drawings

TOP COAT MATERIAL AND USE THEREOF IN LITHOGRAPHY PROCESSES

BACKGROUND OF THE INVENTION

1. Field of the Invention

This invention relates to a top coat material and the use thereof in lithography processes. More particularly, this invention is directed to a top coat material which is easy to apply, insoluble in water but soluble in developer, therefore can be removed in the develop stage. This top coat may be especially useful for immersion lithography in which a liquid such as water is used as the exposure medium between the lens fixture of an exposure tool and the photoresist-coated wafer.

2. Description of the Related Art

Traditionally, top coat materials have been used in photolithography as anti-reflective films on the top of a photoresist. The top anti-reflective coat (TARC) materials can prevent the multiple interference of light that takes place within the photoresist layer during exposure. As a result, the critical dimension (CD) variation of the geometrical features of a photoresist pattern that is caused by the variation in the thickness of the photoresist film can be minimized.

To fully take advantage of the anti-reflective effect of the top coat, the refractive index of the top coat material ($n_t$) should be at about the square root of the multiplication of the refractive index of the exposure medium ($n_m$) and the refractive index of the underlying photoresist ($n_r$). If the exposure medium is air, as in the case for "dry" lithography, the optimal refractive index of the top coat material ($n_t$) should be at about the square root of the refractive index of the underlying photoresist ($n_r$) because the refractive index of air is roughly 1.

For ease of processing, classic TARC materials are designed to be soluble in both water and aqueous base developer so that they can be applied directly from water solution and subsequently removed by the aqueous base developer during the develop stage.

Numerous top coat materials have been developed to meet these two requirements of optimal refractive index and solubility. For example, U.S. Pat. Nos. 5,744,537 and 6,057,080 disclose aqueous-soluble TARC materials comprising a polymeric binder and a fluorocarbon compound, and which have nearly ideal refractive indexes on the order of 1.3-1.4. U.S. Pat. No. 5,879,853 also disclose a TARC material that is removable by a wet process. U.S. Pat. No. 5,595,861 similarly discloses a TARC comprising partially fluorinated compounds, which can also be water soluble. U.S. Pat. No. 6,274,295 discloses a TARC material comprising a light absorbing compound having a wavelength of maximum absorption higher than an exposure wavelength used to expose the photoresist. This TARC can also be water-soluble. Finally, U.S. Pat. No. 5,240,812 discloses a protective material for use as an overcoat film for acid catalyzed resist composition to prevent contamination from vapors of organic and inorganic bases. While not specifically disclosed as being a TARC, the overcoat can also be water soluble.

Immersion lithography offers the potential to extend the use of optical lithography to print smaller features. In immersion lithography, air is replaced by a liquid medium such as water between the lens and the wafer. Use of a medium with an index of refraction higher than air results in a greater numerical aperature (NA), and therefore allows printing of smaller features. See "Technology Backgrounder: Immersion Lithography," published by ICKnowledge.com at http://www.icknowledge.com, May 28, 2003.

See also L. Geppert, "Chip Making's Wet New World," IEEE Spectrum, Vol. 41, Issue 5, May 2004, pp. 29-33.

For liquid immersion lithography, a top coat material can be used in between the exposure medium and the resist-coated wafer to prevent photoresist components from leaching into the immersion medium. A top coat material can also prevent the permeation of the exposure medium into the photoresist film. One of the requirements for the top coat material, of course, is its insolubility in the exposure medium. Preferably, the top coat material can also act as a TARC layer.

Water has been proposed as the exposure medium for 193 nm immersion lithography. Therefore, classic water-soluble TARC materials such as those described above can not be used as top coats for 193 nm immersion lithography. Moreover, since water has higher refractive index (1.47 at 193 nm) than air (~1 at 193 nm), the optimal refractive index for TARC materials used for 193 nm immersion lithography is also higher than that of classic TARCs.

Thus, there remains a need for a top coat material that is insoluble in water but soluble in aqueous base developer, and also has desired optical properties so that it can also be used as a TARC.

SUMMARY OF THE INVENTION

Accordingly, the present invention is directed to a top coat material for applying on top of a photoresist material. The top coat material comprises a polymer, which comprises at least one fluorosulfonamide monomer unit having one of the following two structures:

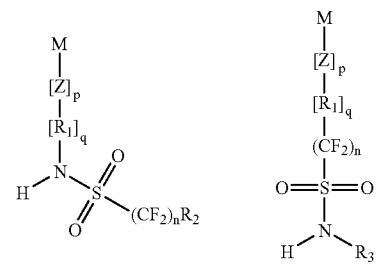

wherein: M is a polymerizable backbone moiety; Z is a linking moiety selected from the group consisting of —C(O)O—, —C(O)—, —OC(O)—, and —O—C(O)—C(O)—O—; $R_1$ is selected from the group consisting of an alkylene, an arylene, a semi- or perfluorinated alkylene, and a semi- or perfluorinated arylene; p and q are 0 or 1; $R_2$ is selected from the group consisting of hydrogen, fluorine, an alkyl group of 1 to 6 carbons, and a semi- or perfluorinated alkyl group of 1 to 6 carbons; n is an integer from 1 to 6; and $R_3$ is selected from the group consisting of hydrogen, an alkyl, an aryl, a semi- or perfluorinated alkyl, and a semi- or perfluorinated aryl.

In another aspect, the invention is directed to a method of forming a patterned material layer on a substrate, the method comprising: providing a substrate having a material layer on a surface thereof; depositing a photoresist composition on the substrate to form a photoresist layer on the material; applying the top coat material mentioned above on the photoresist layer, thereby forming a coated substrate; patternwise exposing the coated substrate to imaging irradiation; contacting the coated substrate with an aqueous alkaline developer, wherein the top coat material and a portion of the photoresist layer are simultaneously removed from the coated substrate, thereby forming a patterned photoresist layer on the material layer; and transferring the pattern in the photoresist layer to the material layer.

DETAILED DESCRIPTION OF THE INVENTION

The present invention is directed to a top coat material comprising a polymer which comprises a repeating unit with a fluorosulfonamide structure. The top coat is preferably insoluble in water but soluble in aqueous base developer so that it can be used for 193 nm immersion lithography. Additionally, the top coat material of the present invention can be adjusted to act as a TARC so that better process control of image formation can be achieved. For 193 nm immersion lithography using water as the exposure medium, the optimal refractive index for a TARC material is about 1.5 to 1.7.

The invention is specifically directed to a top coat material comprising a polymer which comprises at least one fluorosulfonamide monomer unit preferably having one of the following two structures:

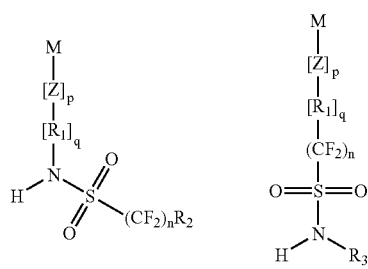

wherein: M is a polymerizable backbone moiety; Z is a linking moiety selected from the group consisting of —C(O)O—, —C(O)—, —OC(O)—, and —O—C(O)—C(O)—O—; $R_1$ represents one of an alkylene, an arylene, a semi- or perfluorinated alkylene, and a semi- or perfluorinated arylene; p and q are 0 or 1; $R_2$ represents one of hydrogen, fluorine, an alkyl group of 1 to 6 carbons, and a semi- or perfluorinated alkyl group of 1 to 6 carbons; n is an integer from 1 to 6; and $R_3$ represents one of hydrogen, an alkyl, an aryl, a semi- or perfluorinated alkyl, and a semi- or perfluorinated aryl.

Examples of the polymerizable backbone moiety, M, include:

where $R_4$ represents hydrogen, an alkyl group of 1 to 20 carbons, a semi- or perfluorinated alkyl group of 1 to 20 carbons, or CN; and

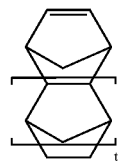

where t is an integer from 0 to 3.

In exemplary embodiments of the present invention, the fluorosulfonamide monomer unit may include, but is not limited to:

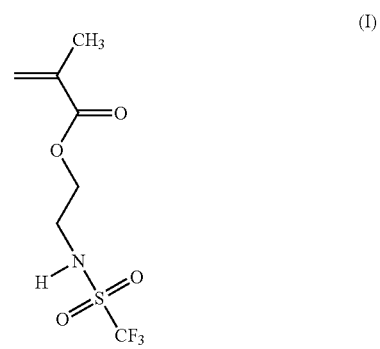

(I)

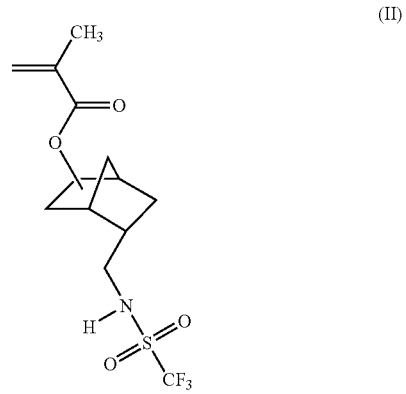

(II)

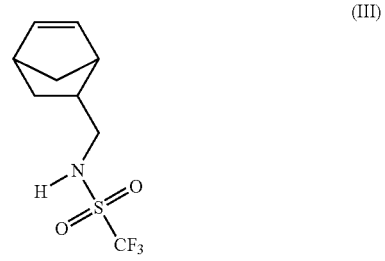

(III)

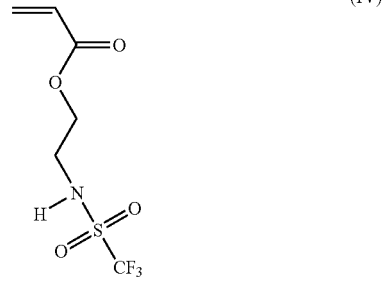

(IV)

(V)
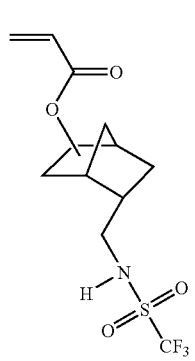
(VI)
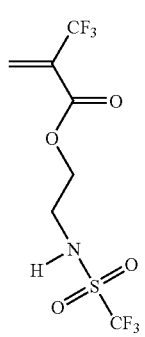
(VII)
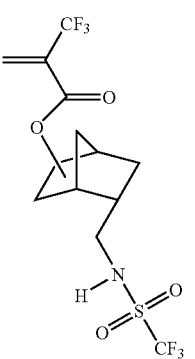
The polymer of the top coat material may further comprise at least one co-monomer unit to permit further regulation of, for example, dissolution properties and thermal properties in exemplary embodiments. Examples of such co-monomer units include, but are not limited to:
(VIII)
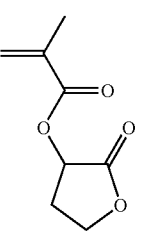
(IX)
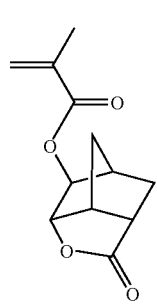
(X)
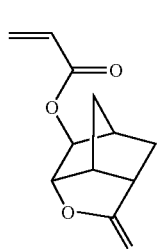
(XI)
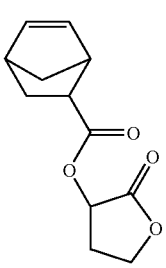
(XII)
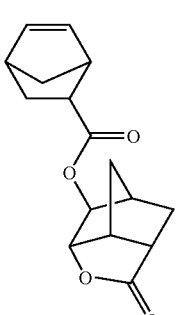
(XIII)
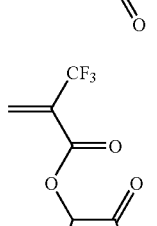
(XIV)

-continued
(XV)
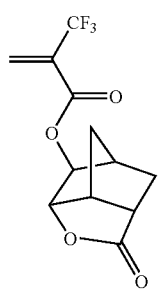
(XVI)
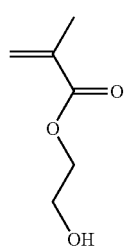
(XVII)
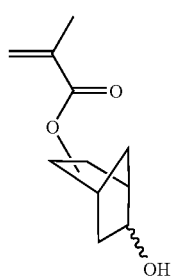
(XVIII)
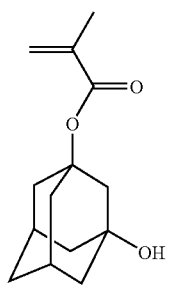
(XIX)
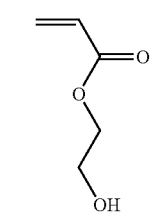
(XX)
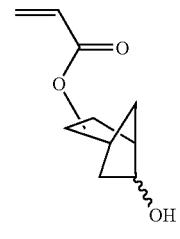
-continued
(XXI)
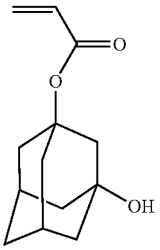
(XXII)
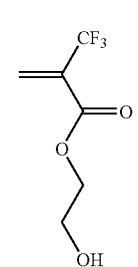
(XXIII)
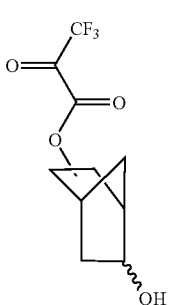
(XXIV)
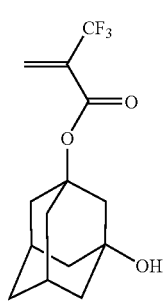
(XXV)
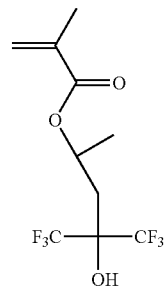

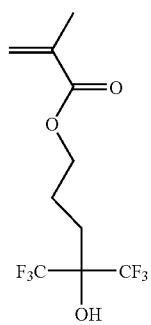 (XXVI)
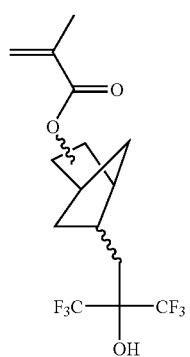 (XXVII)
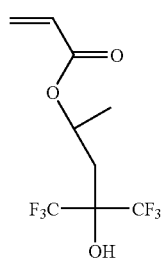 (XXVIII)
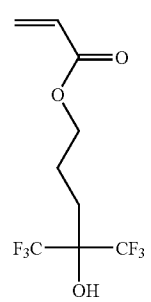 (XXIX)
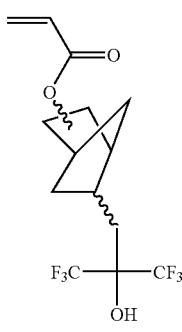 (XXX)
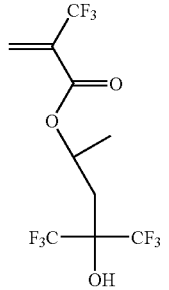 (XXXI)
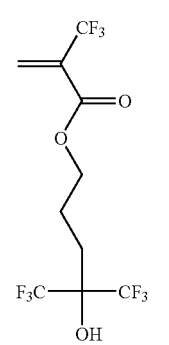 (XXXII)
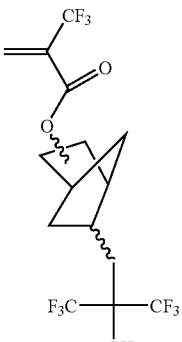 (XXXIII)
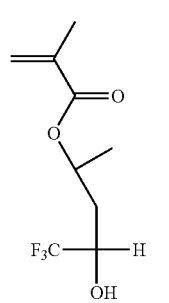 (XXXIV)
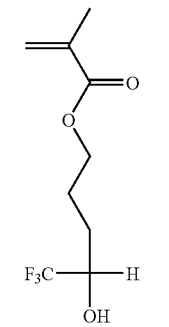 (XXXV)

-continued
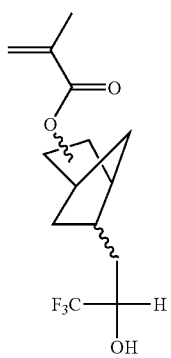 (XXXVI)
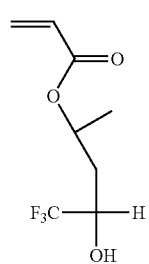 (XXXVII)
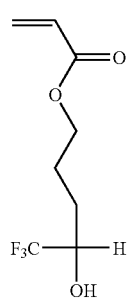 (XXXVIII)
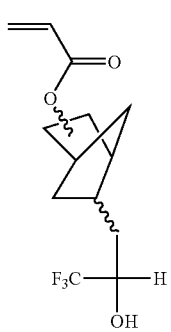 (XXXIX)
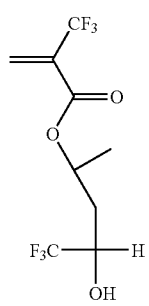 (XXXX)
-continued
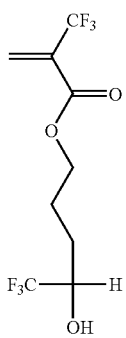 (XXXXI)
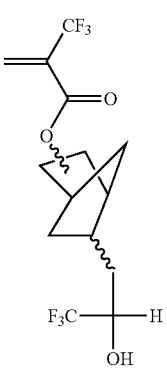 (XXXXII)
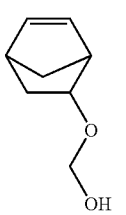 (XXXXIII)
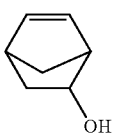 (XXXXIV)
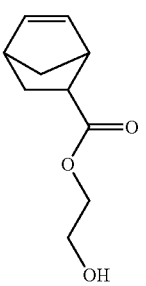 (XXXXV)
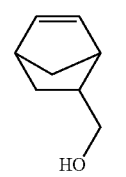 (XXXXVI)

-continued

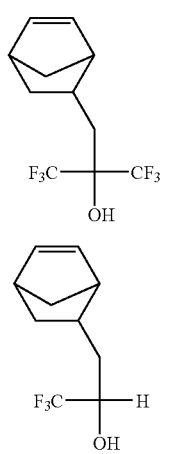

(XXXXVII)

(XXXXVIII)

The top coat material may further comprise at least one solvent which is preferably immiscible with the underlying photoresist material. Suitable solvents include, but are not limited to: 1-butanol, methanol, ethanol, 1-propanol, ethylene glycol, 1,2-butanediol, 1,3-butanediol, 1,4-butanediol, 1,2-propanediol, and 1,3-propanediol.

The top coat material of the invention is preferably insoluble in water but is soluble in aqueous base developer. Moreover, the top coat material is preferably substantially optically transparent to the exposure radiation for the underlying photoresist material, to allow patterning of the photoresist material.

It is also preferable that the top coat material have a refractive index in the range of about 1.2 to 1.8. For 193 nm immersion lithography using water as the exposure medium, the refractive index of the top coat material is most preferably in the range of about 1.5 to 1.7.

In another aspect of the invention, the top coat material may be used in a method of forming a patterned material layer on a substrate. The material layer may be, for example, a ceramic, dielectric, metal or semiconductor layer, such as those used in the manufacture of high performance integrated circuit devices and associated chip carrier packages. In the method, a photoresist composition is first deposited on the substrate by known means, to form a photoresist layer on the material. The substrate with the resist layer then may be baked (pre-exposure bake) to remove any solvent from the photoresist composition and improve the coherence of the resist layer. Typical pre-exposure baking temperature is about 80 to about 150° C. Typical resist thickness is about 100 to about 500 nm. Any suitable resist composition may be used, such as the resist composition disclosed in U.S. Pat. Nos. 6,534,239 and 6,635,401 B2, and U.S. patent application Ser. No. 10/663,553, filed Sep. 16, 2003, the disclosures of which are incorporated herein by reference.

Next, the top coat material of the invention is applied on the photoresist layer, thereby forming a coated substrate. The coated substrate is then exposed to an appropriate irradiation source, through a patterned mask. In one exemplary embodiment, the imaging radiation is 193 nm radiation. In another embodiment, the imaging radiation is 157 nm radiation. In another embodiment, the imaging radiation is 248 nm radiation. The coated substrate also may be exposed to such imaging radiation using immersion lithography, wherein an imaging medium is applied to the coated substrate prior to exposure. In a preferred embodiment, the imaging medium is water.

The coated substrate is then contacted with an aqueous base developer, such as 0.263 N tetramethyl ammonium hydroxide, thereby removing the top coat material and a portion of the photoresist layer simultaneously from the coated substrate. Contact with developer forms a patterned photoresist layer on the material layer.

The pattern in the photoresist layer then may be transferred to the material layer on the underlying substrate. Typically, the transfer is achieved by reactive ion etching or some other etching technique. The method of the invention may be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes to making these (ceramic, dielectric, metal or semiconductor) features generally involve providing a material layer or section of the substrate to be patterned, applying a layer of resist over the material layer or section, applying a top coat layer on the layer of resist, patternwise exposing the top coat and resist layers to radiation, developing the pattern by contacting the exposed top coat and resist with a developer, etching the layer(s) underlying the resist layer at spaces in the pattern whereby a patterned material layer or substrate is formed, and removing any remaining resist from the substrate. In some instances, a hard mask may be used below the resist layer to facilitate transfer of the pattern to a further underlying material layer or section. It should be understood that the invention is not limited to any specific lithography technique or device structure.

The following non-limiting examples are provided to further illustrate the present invention. Because these examples are provided for illustrative purposes only, the invention embodied therein should be limited thereto.

EXAMPLE 1

Synthesis of poly(2-trifluoromethanesulfonylaminoethyl methacrylate)(poly(I))

A solution of 7.8 g (0.03 mol) of 2-trifluoromethanesulfonylaminoethyl methacrylate (I) and 0.061 g (0.0003 mol) dodecanethiol in 22.6 g of 2-butanone was first prepared. To this solution was added 0.148 g (0.0009 mol) of 2,2'-azobisisobutyronitrile (AIBN). The solution was deoxygenated by bubbling dry $N_2$ for 0.5 hr and then allowed to reflux for 12 hr. The reaction mixture was cooled to room temperature and precipitated in 400 ml of hexanes with rigorous stirring. The resulting white solid was collected by filtration, washed with several portions of hexanes and dried under vacuum at 60° C. for 20 hr.

EXAMPLE 2

Synthesis of poly(I-co-XVIII)

A solution of 4.7 g (0.018 mol) of 2-trifluoromethanesulfonylaminoethyl methacrylate (I), 2.83 g (0.012 mol) hydroxyadamantyl methacrylate (XVIII) and 0.061 g (0.0003 mol) dodecanethiol in 22.6 g of 2-butanone was first prepared. To this solution was added 0.148 g (0.0009 mol) of AIBN. The solution was deoxygenated by bubbling dry N₂ for 0.5 hr and then allowed to reflux for 12 hr. The reaction mixture was cooled to room temperature and precipitated in 400 ml of hexanes with rigorous stirring. The resulting white solid was collected by filtration, washed with several portions of hexanes and dried under vacuum at 60° C. for 20 hr.

EXAMPLE 3

Synthesis of poly(I-co-XVIII-co-XVI)

A solution of 5.22 g (0.02 mol) of 2-trifluoromethanesulfonylaminoethyl methacrylate (I), 3.78 g (0.016 mol) hydroxyadamantyl methacrylate (XVIII), 0.52 g (0.004 mol) 2-hydroxyethyl methacrylate (XVI), and 0.081 g (0.0004 mol) dodecanethiol in 22.6 g of 2-butanone was first prepared. To this solution was added 0.197 g (0.0012 mol) of AIBN. The solution was deoxygenated by bubbling dry N₂ for 0.5 hr and then allowed to reflux for 12 hr. The reaction mixture was cooled to room temperature and precipitated in 400 ml of hexanes with rigorous stirring. The resulting white solid was collected by filtration, washed with several portions of hexanes and dried under vacuum at 60° C. for 20 hr.

EXAMPLE 4

Synthesis of poly(I-co-VIII-co-XVIII-co-XVI)

A solution of 2.35 g (0.009 mol) of 2-trifluoromethanesulfonylaminoethyl methacrylate (I), 1.53 g (0.009 mol) 2-methacryloyl-γ-butyrolactone (VIII), 2.12 g (0.009 mol) hydroxyadamantyl methacrylate (XVIII), 0.39 g (0.003 mol) 2-hydroxyethyl methacrylate (XVI), and 0.182 g (0.0009 mol) dodecanethiol in 22.6 g of 2-butanone was first prepared. To this solution was added 0.246 g (0.0015 mol) of AIBN. The solution was deoxygenated by bubbling dry N₂ for 0.5 hr and then allowed to reflux for 12 hr. The reaction mixture was cooled to room temperature and precipitated in 400 ml of hexanes with rigorous stirring. The resulting white solid was collected by filtration, washed with several portions of hexanes and dried under vacuum at 60° C. for 20 hr.

EXAMPLE 5

Synthesis of poly(trifluoromethanesulfonylaminomethyl norbornene)(poly(III))

A homopolymer of trifluoromethanesulfonylaminomethyl norbornene (III) was prepared by addition polymerization.

EXAMPLE 6

Lithographic Evaluation

For the purpose of evaluative lithographic experiments, a top coat material containing the polymer prepared in Example 5 (3% by weight) and 1-butanol (97% by weight) was prepared. The top coat material was applied over a photoresist (AMX1741, from JSR) coated wafer. The films were baked at 110° C. for 60 seconds. The thickness of the top coat was ~50 nm.

The following water solubility test was then conducted. The coated substrate was immersed in water for 2 minutes. Thickness measured before and after immersion confirmed that there was no thickness loss of the top coat material in water.

The above coated wafer was then exposed with 0.75 NA lithography tool using 193 nm radiation. As a comparison, a wafer coted with AMX1741 photoresist without the top coat material was also exposed at the same time. Both wafers were able to resolve L/S (line/space) pairs down to 90 nm 1:1 L/S. The wafer with the top coat showed improved profiles and exposure latitude over the one without top coat.

Thickness measurement before and after develop confirmed that the top coat material was completely removed during develop stage. In the mean time, no additional thickness loss was observed in the unexposed area with the use of the top coat.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

What is claimed is:

1. A top coat material for applying on top of a photoresist material, the top coat material consisting essentially of a solvent and a polymer, said polymer comprising at least one fluorosulfonamide monomer unit having one of the following two structures:

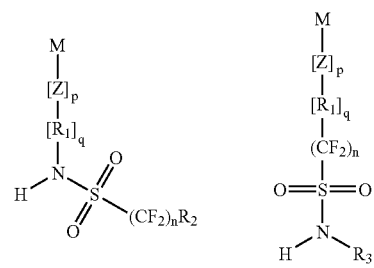

wherein:

M is a polymerizable backbone moiety;

Z is a linking moiety selected from the group consisting of —C(O)O—, —C(O)—, —OC(O)—, and —O—C(O)—C(O)—O—;

R₁ is selected from the group consisting of an alkylene, an arylene, a semi- or perfluorinated alkylene, and a semi- or perfluorinated arylene;

p and q are 0 or 1;

R₂ is selected from the group consisting of hydrogen, fluorine, an alkyl group of 1 to 6 carbons, and a semi- or perfluorinated alkyl group of 1 to 6 carbons;

n is an integer from 1 to 6; and

R₃ is selected from the group consisting of hydrogen, an alkyl, an aryl, a semi- or perfluorinated alkyl, and a semi- or perfluorinated aryl.

2. The top coat material of claim 1, wherein M is a polymerizable backbone moiety having one of the following two structures:

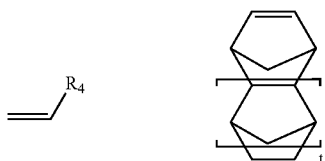

wherein:

R₄ is selected from the group consisting of hydrogen, an alkyl group of 1 to 20 carbons, a semi- or perfluorinated alkyl group of 1 to 20 carbons, and CN; and t is an integer from 0 to 3.

3. The top coat material of claim 1, wherein said solvent is immiscible with the photoresist material.

4. The top coat material of claim 1, wherein the solvent is selected from the group consisting of 1-butanol, methanol, ethanol, 1- propanol, ethylene glycol, 1,2-butanediol, 1,3-butanediol, 1,4-butanediol, 1,2-propanediol, and 1,3-propanediol.

5. The top coat material of claim 1, wherein the top coat material is insoluble in water.

6. The top coat material of claim 5, wherein the top coat material is soluble in aqueous alkaline developer.

7. The top coat material of claim 1, wherein the top coat material is substantially optically transparent to the exposure radiation for the underlying photoresist material.

8. The top coat material of claim 1, wherein the top coat material has a refractive index in the range of about 1.2 to 1.8.

9. The top coat material of claim 1, wherein the top coat material has a refractive index in the range of about 1.5 to 1.7.

10. The top coat material of claim 1, wherein the fluorosulfonamide monomer unit is selected from the group consisting of:

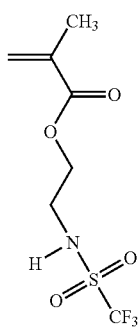
(I)

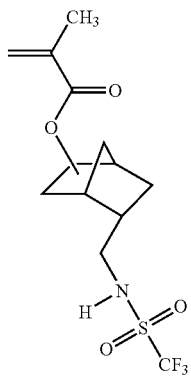
(II)

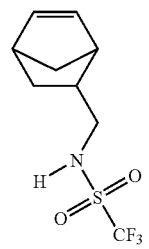
(III)

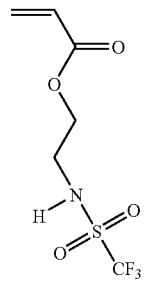
(IV)

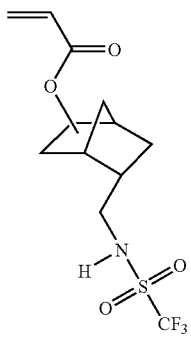
(V)

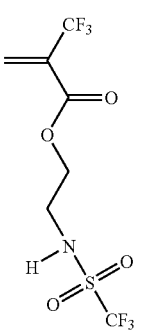
(VI)

-continued
(VII)
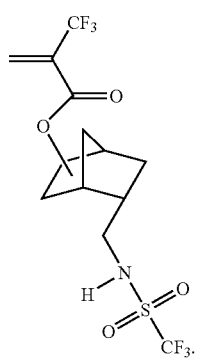
11. The top coat material of claim 1, wherein the polymer further comprises a co-monomer unit selected from the group consisting of:
(VIII)
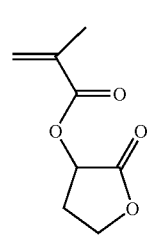
(IX)
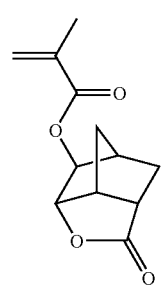
(X)
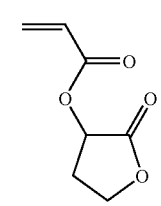
(XI)
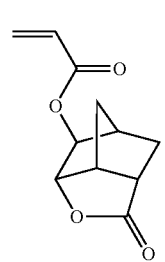
-continued
(XII)
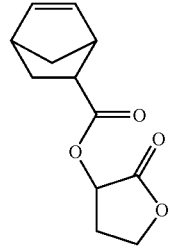
(XIII)
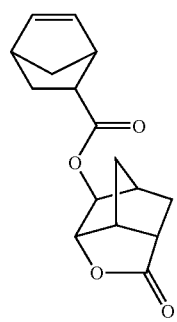
(XIV)
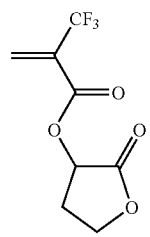
(XV)
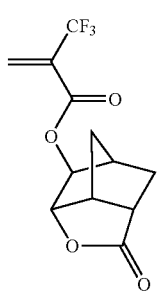
(XVI)
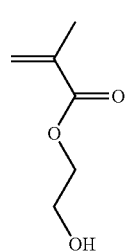

-continued
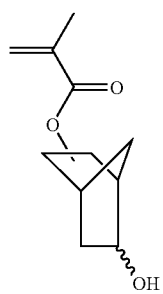
(XVII)
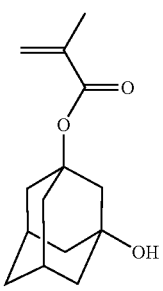
(XVIII)
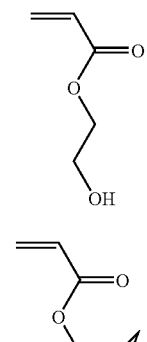
(XIX)
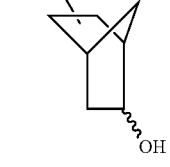
(XX)
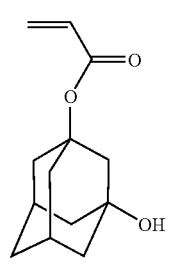
(XXI)
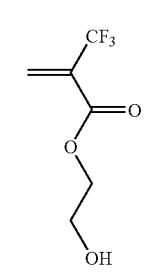
(XXII)
-continued
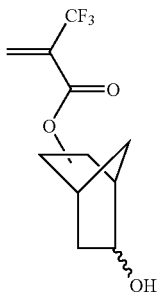
(XXIII)
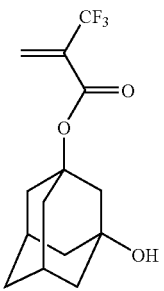
(XXIV)
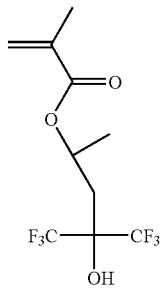
(XXV)
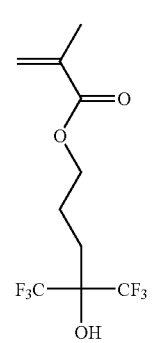
(XXVI)
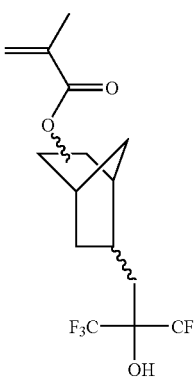
(XXVII)

-continued
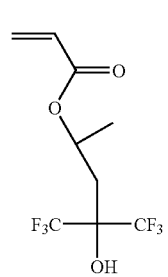
(XXVIII)
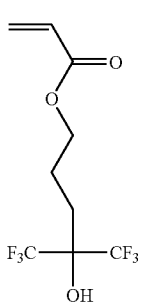
(XXIX)
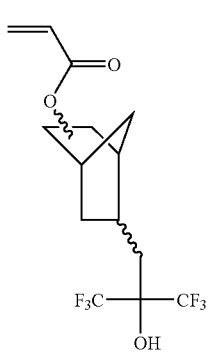
(XXX)
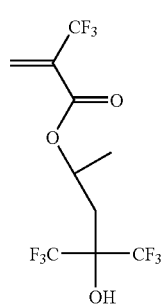
(XXXI)
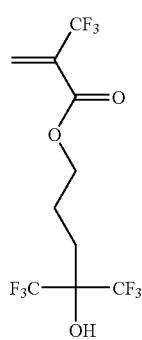
(XXXII)
-continued
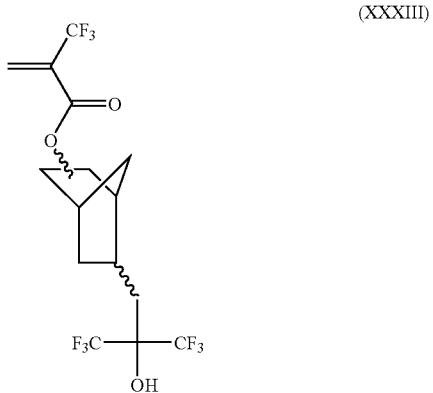
(XXXIII)
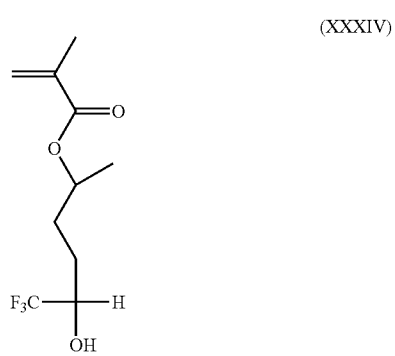
(XXXIV)
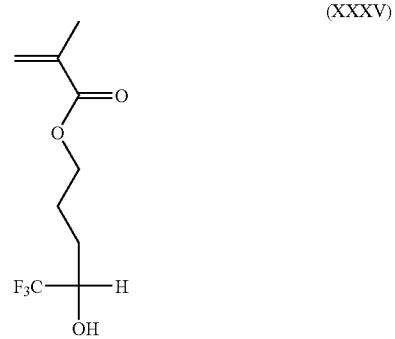
(XXXV)
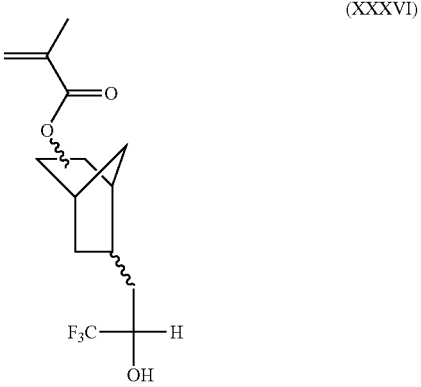
(XXXVI)

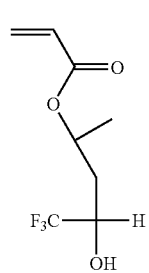
(XXXVII)
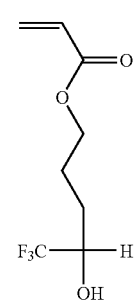
(XXXVIII)
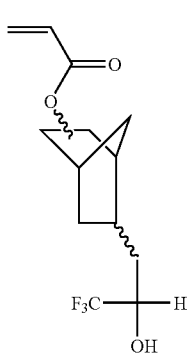
(XXXIX)
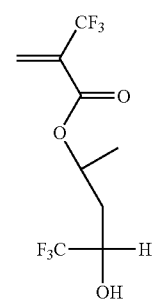
(XXXX)
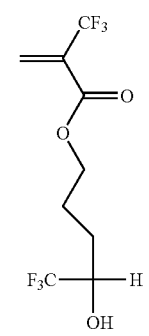
(XXXXI)
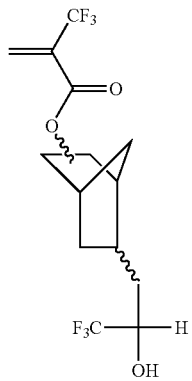
(XXXXII)
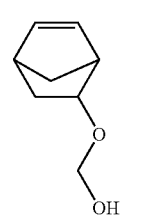
(XXXXIII)
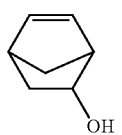
(XXXXIV)
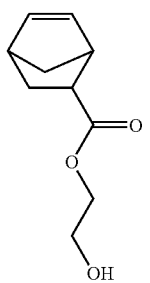
(XXXXV)
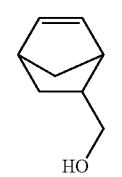
(XXXXVI)
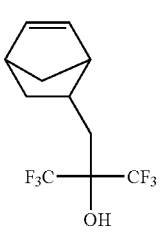
(XXXXVII)

-continued (XXXXVIII)

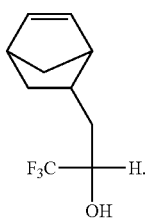

12. A top coat material for applying on top of a photoresist material, the top coat material a polymer, said polymer comprising at least one fluorosulfonamide monomer unit having one of the following two structures:

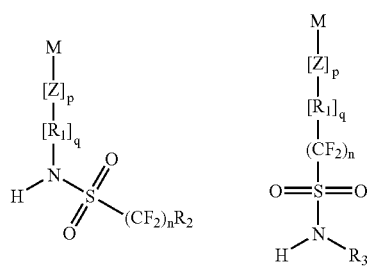

wherein:
M is a polymerizable backbone moiety;
Z is a linking moiety selected from the group consisting of —O(O)O—, —C(O)—, —OC(O)—, and 13 O—C(O)—C(O)—O—;
$R_1$ is selected from the group consisting of an alkylene, an arylene, a semi- or perfluorinated alkylene, and a semi- or perfluorinated arylene;
p and q are 0 or 1;
$R_2$ is selected from the group consisting of hydrogen, fluorine, an alkyl group of 1 to 6 carbons, and a semi- or perfluorinated alkyl group of 1 to 6 carbons;
n is an integer from 1 to 6; and
$R_3$ is selected from the group consisting of hydrogen, an alkyl, an aryl, a semi- or perfluorinated alkyl, and a semi- or perfluorinated aryl, and M is a polymerizable backbone moiety having one of the following two structures:

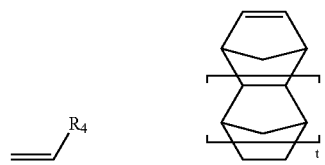

wherein:
$R_4$ is selected from the group consisting of hydrogen, an alkyl group of 1 to 20 carbons, a semi- or perfluorinated alkyl group of 1 to 20 carbons, and CN; and
t is an integer from 0 to 3.

13. The top coat material of claim 12, further comprising a solvent which is immiscible with the photoresist material.

14. The top coat material of claim 12, wherein the solvent is selected from the group consisting of 1-butanol, methanol, ethanol, 1-propanol, ethylene glycol, 1,2-butanediol, 1,3-butanediol, 1,4-butanediol, 1,2-propanediol, and 1,3-propanediol.

15. The top coat material of claim 12, wherein the top coat material is insoluble in water.

16. The top coat material of claim 15, wherein the top coat material is soluble in aqueous alkaline developer.

17. The top coat material of claim 12, wherein the top coat material is substantially optically transparent to the exposure radiation for the underlying photoresist material.

18. The top coat material of claim 12, wherein the top coat material has a refractive index in the range of about 1.2 to 1.8.

19. The top coat material of claim 12, wherein the top coat material has a refractive index in the range of about 1.5 to 1.7.

20. The top coat material of claim 12, wherein the fluorosulfonamide monomer unit is selected from the group consisting of:

(I)

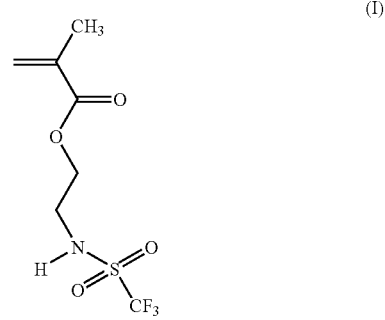

(II)

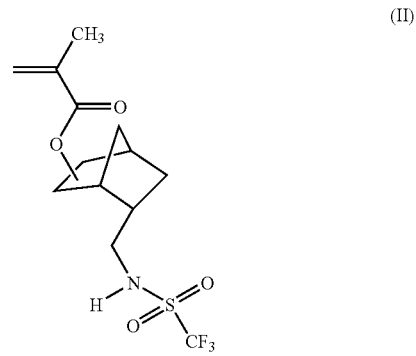

-continued
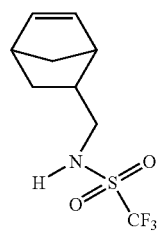 (III)
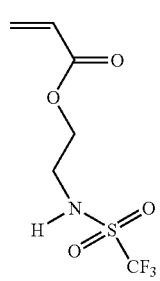 (IV)
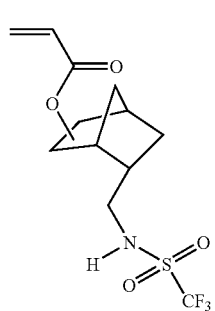 (V)
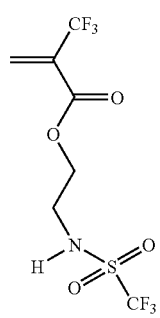 (VI)
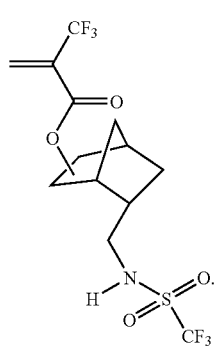 (VII)
21. The top coat material of claim 12, wherein the polymer further comprises a co-monomer unit selected from the group consisting of:
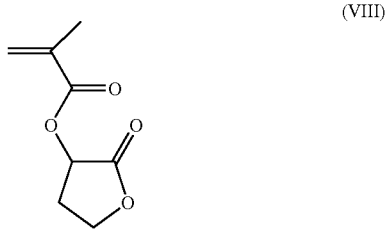 (VIII)
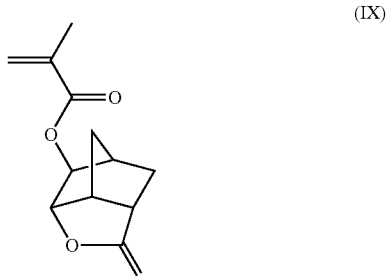 (IX)
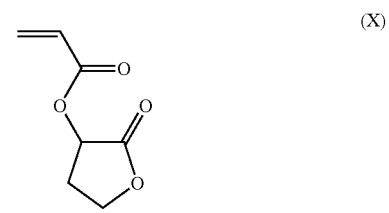 (X)
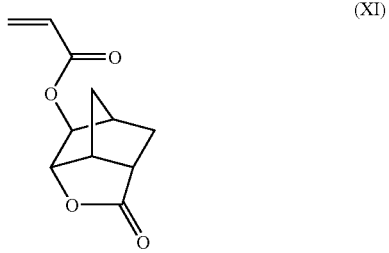 (XI)
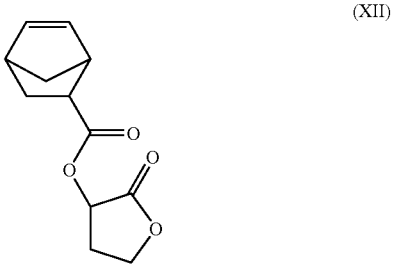 (XII)

-continued
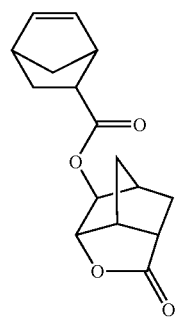
(XIII)
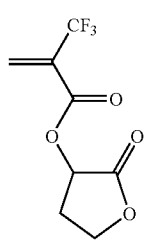
(XIV)
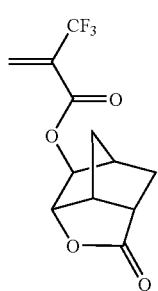
(XV)
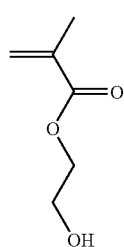
(XVI)
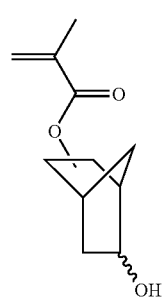
(XVII)
-continued
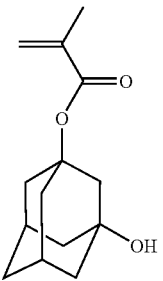
(XVIII)
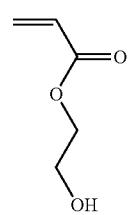
(XIX)
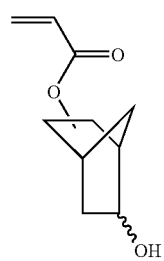
(XX)
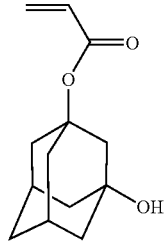
(XXI)
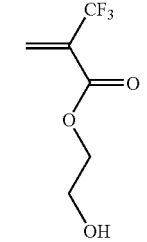
(XXII)
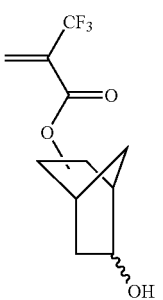
(XXIII)

-continued
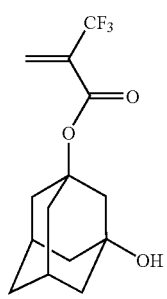
(XXIV)
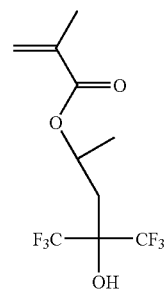
(XXV)
(XXVI)
(XXVII)
(XXVIII)
-continued
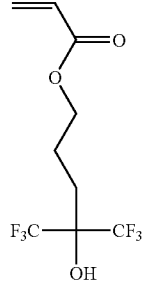
(XXIX)
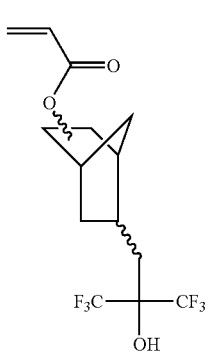
(XXX)
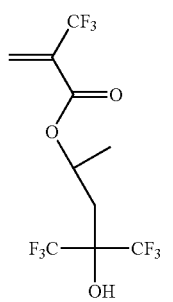
(XXXI)
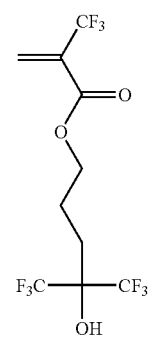
(XXXII)

-continued
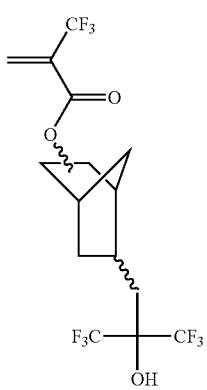 (XXXIII)
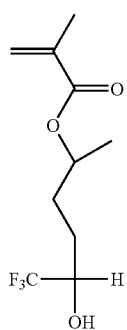 (XXXIV)
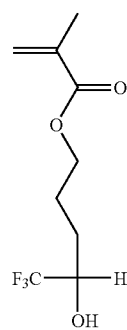 (XXXV)
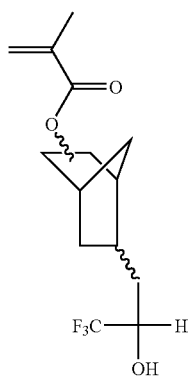 (XXXVI)
-continued
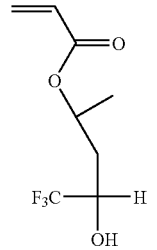 (XXXVII)
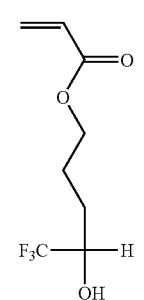 (XXXVIII)
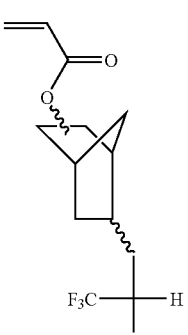 (XXXIX)
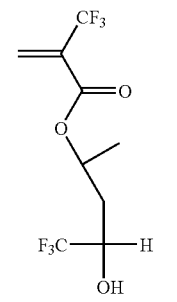 (XXXX)
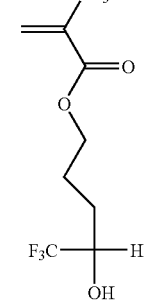 (XXXXI)

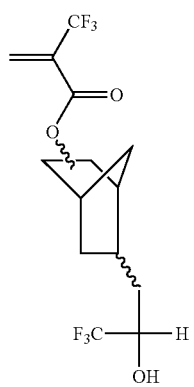
(XXXXII)
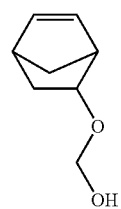
(XXXXIII)
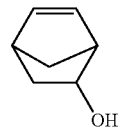
(XXXXIV)
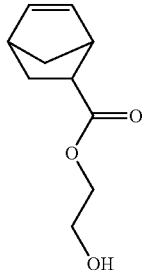
(XXXXV)
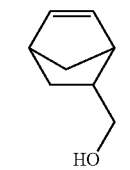
(XXXXVI)
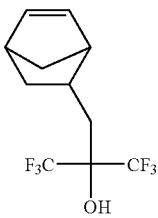
(XXXXVII)
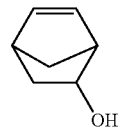
(XXXXVIII)
* * * * *